(12) United States Patent
Pagani

(10) Patent No.: US 9,318,516 B2
(45) Date of Patent: Apr. 19, 2016

(54) HIGH-FREQUENCY OPTOELECTRONIC DETECTOR, SYSTEM AND METHOD

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 120 days.

(21) Appl. No.: 13/933,898

(22) Filed: Jul. 2, 2013

(65) Prior Publication Data

US 2014/0001521 A1   Jan. 2, 2014

(30) Foreign Application Priority Data

Jul. 2, 2012   (IT) ............... TO2012A0584

(51) Int. Cl.

| | |
|---|---|
| *H01L 27/14* | (2006.01) |
| *H01L 31/02* | (2006.01) |
| *H01L 31/0216* | (2014.01) |
| *H01L 27/146* | (2006.01) |
| *H01L 31/105* | (2006.01) |

(52) U.S. Cl.
CPC .......... *H01L 27/14* (2013.01); *H01L 27/14643* (2013.01); *H01L 31/02* (2013.01); *H01L 31/0216* (2013.01); *H01L 31/105* (2013.01)

(58) Field of Classification Search
CPC ................. H01L 31/0232; H01L 31/02327; H01L 27/14; H01L 31/02; H01L 31/0216; H01L 27/14643; H01L 27/14645; H01L 31/105
USPC ................................. 257/290, 431, 437, 443
See application file for complete search history.

(56) References Cited

U.S. PATENT DOCUMENTS

| | | | |
|---|---|---|---|
| 6,147,349 A * | 11/2000 | Ray .......................... 250/338.4 |
| 7,068,432 B2 * | 6/2006 | Boettiger et al. ............. 359/619 |
| 7,129,489 B2 * | 10/2006 | Pham ......................... 250/338.4 |
| 2002/0187581 A1 | 12/2002 | Yang |
| 2004/0113231 A1 * | 6/2004 | Hoag et al. .................... 257/528 |
| 2007/0158664 A1 | 7/2007 | Rothman |
| 2007/0274014 A1 * | 11/2007 | Berberich et al. ........... 361/91.7 |
| 2009/0218594 A1 | 9/2009 | Ishimura et al. |
| 2011/0175188 A1 * | 7/2011 | Bui et al. ...................... 257/443 |

* cited by examiner

*Primary Examiner* — William F Kraig
*Assistant Examiner* — Pavel Ivanov
(74) *Attorney, Agent, or Firm* — Gardere Wynne Sewell LLP

(57) ABSTRACT

An optoelectronic device for detecting electromagnetic radiation and including: a body of semiconductor material delimited by a main surface and including a first region and a second region that form a junction; and a recess formed in the body, which extends from the main surface and is delimited at least by a first wall, the first wall being arranged transverse to the main surface. The junction faces the first wall.

17 Claims, 13 Drawing Sheets

US 9,318,516 B2

HIGH-FREQUENCY OPTOELECTRONIC DETECTOR, SYSTEM AND METHOD

PRIORITY CLAIM

The present application claims priority to Italian Patent Application No. TO2012A000584, filed Jul. 2, 2012, which application is incorporated herein by reference in its entirety.

TECHNICAL FIELD

The present disclosure relates to a high-frequency optoelectronic detector.

BACKGROUND

In general, an optoelectronic detector is an electronic device that, when it receives electromagnetic radiation, generates an electrical signal indicating characteristics of this electromagnetic radiation. For example, among optoelectronic detectors are numbered photodiodes and phototransistors.

With reference, purely by way of example, to photodiodes, they may have a planar structure, or else a so-called MESA structure.

As illustrated in FIG. 1a, a MESA structure of a photodiode 1 is formed by a semiconductor body 2, which comprises, in addition to a substrate 3, a first epitaxial layer 4 and a second epitaxial layer 6, which form a PN junction. The semiconductor body 2 is formed by means of epitaxial growth of the first and second epitaxial layers 4, 6, and subsequent wet chemical etching so that the profile of the semiconductor body 2 forms precisely a structure that evokes a mesa, which is delimited by side walls L that have a slope gradually decreasing starting from the second epitaxial layer 6 towards the substrate 3. The anode and cathode metallizations are not illustrated in FIG. 1a.

As illustrated in FIG. 1b, in a planar structure of the photodiode 1, the semiconductor body 2 is formed not only by the substrate 3 but also by the first epitaxial layer 4, by a semiconductor well 8, which is formed by means of a process of diffusion within the first epitaxial layer 4, with which it forms the PN junction. The anode and cathode metallizations are not illustrated in FIG. 1b either.

In general, the MESA structure prevents leakages caused by dicing of the wafer in which the photodiode is formed, this dicing typically damages the crystalline structure of the semiconductor material. As regards, instead, the planar structure, it is characterized by a high level of reliability since, by appropriately designing the semiconductor well 8, the PN junction is prevented from being exposed to external agents, which may potentially alter the PN junction, causing an increase of the leakages.

With reference, purely by way of example, to the planar structure, operation of the photodiode 1 is illustrated in FIG. 2, where designated by I is the interface surface between the first epitaxial layer 4 and the semiconductor well 8.

In use, the photodiode 1 is reversely biased. In addition, formed at the interface surface I is a depleted or depletion region 10, which extends in part in the semiconductor well 8 and in part in the first epitaxial layer 4. Present within the depletion region 10 is an electric field, which, on the basis of semiconductor well 8 being of a P type and first epitaxial layer 4 of an N type, is directed from the first epitaxial layer 4 towards the semiconductor well 8.

Assuming that an optical pulse 11 is impinging upon the photodiode 1, the photodiode 1 generates a corresponding electrical signal, which is formed by a first component and a second component. The first component is formed by the charge carriers generated following upon absorption of photons in the depletion region 10, whilst the second component is generated by the charge carriers that are generated following absorption of photons in regions different from the depletion region 10, these charge carriers diffusing slowly until they reach the depletion region 10. An example of an electrical signal generated responsive to optical pulse 11 is illustrated in FIG. 3, where the first and second components are designated by 1C and 2C.

In practice, the first component is a so-called "fast component", as compared to the second component, which is also known as "slow component". In fact, once the optical pulse 11 impinges upon the photodiode 1, the first component is generated before the second component; moreover, the first component is characterized by a time derivative greater than the derivative of the second component. In greater detail, as the electric field increases in the depletion region 10, the speed of the (minority) charge carriers increases within the depletion region 10, and hence the rapidity of generation of the first component increases, with consequent increase of the maximum operating frequency of the photodiode 1 itself. It is hence possible, for example, to detect correctly an optical signal modulated at high frequency with a modulation of the ON-OFF type.

SUMMARY

The aim of the present disclosure is to provide an optoelectronic detector that will have a further increased operating frequency.

According to an embodiment of the present disclosure an optoelectronic device operable to detect electromagnetic radiation includes a body of semiconductor material delimited by a main surface and including a first region and a second region that form a junction. A recess is formed in the body, which extends from the main surface, and is delimited at least by a first wall. The first wall is arranged transverse to the main surface and the junction faces the first wall.

BRIEF DESCRIPTION OF THE DRAWINGS

For a better understanding of the present invention, preferred embodiments thereof are now described, purely by way of non-limiting examples, with reference to the attached drawings, wherein:

FIG. 8b is a schematic illustration of a top plan view of the optoelectronic detector illustrated in FIG. 8a.

DETAILED DESCRIPTION

Figure 1:
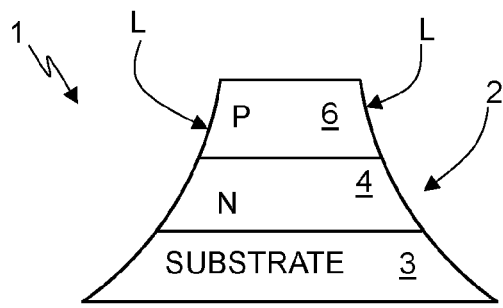
FIGS. 1a and 1b are schematic illustrations of cross sections of known photodiodes.
Figure 1B:
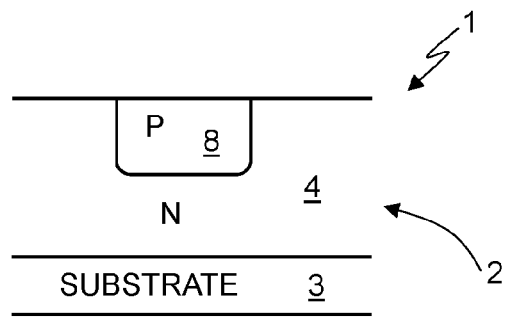
Figure 2:
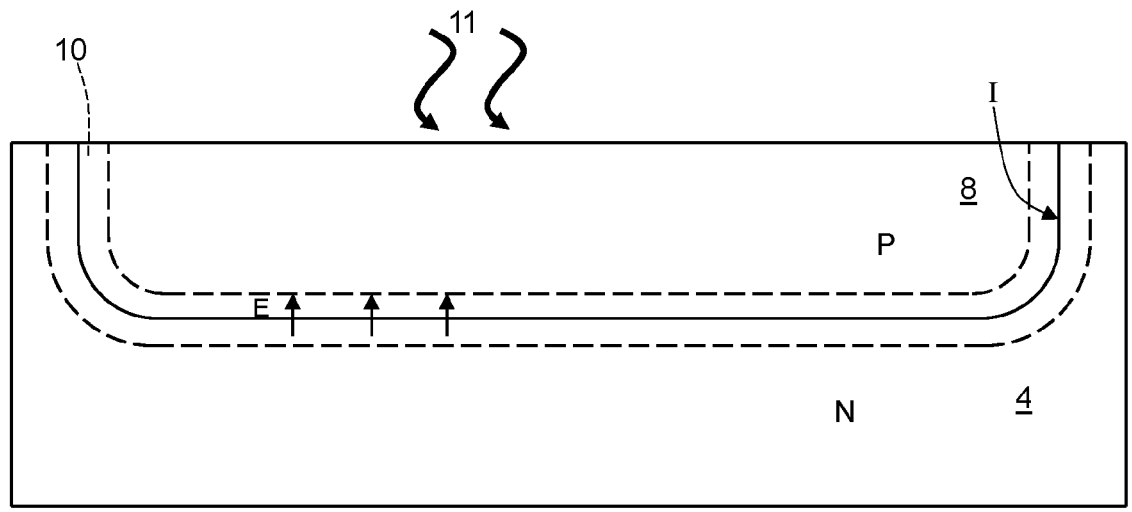
FIG. 2 is a schematic illustration of a cross section of a known photodiode of a planar type.
Figure 3:
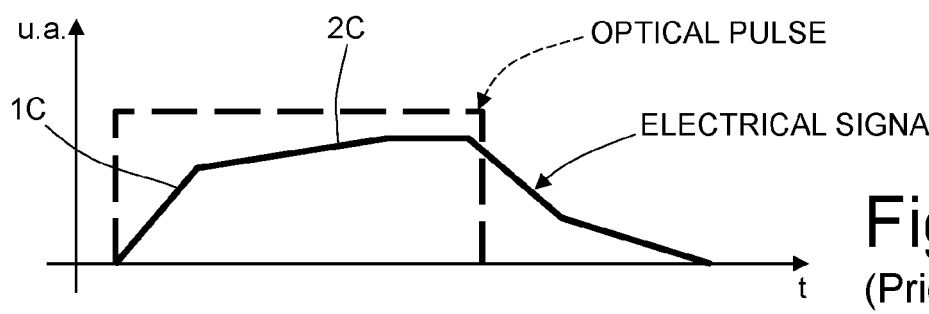
FIG. 3 is a qualitative time plot of an electrical signal (expressed in arbitrary units) generated by the photodiode illustrated in FIG. 2, following impinging of an optical pulse.
Figure 4:
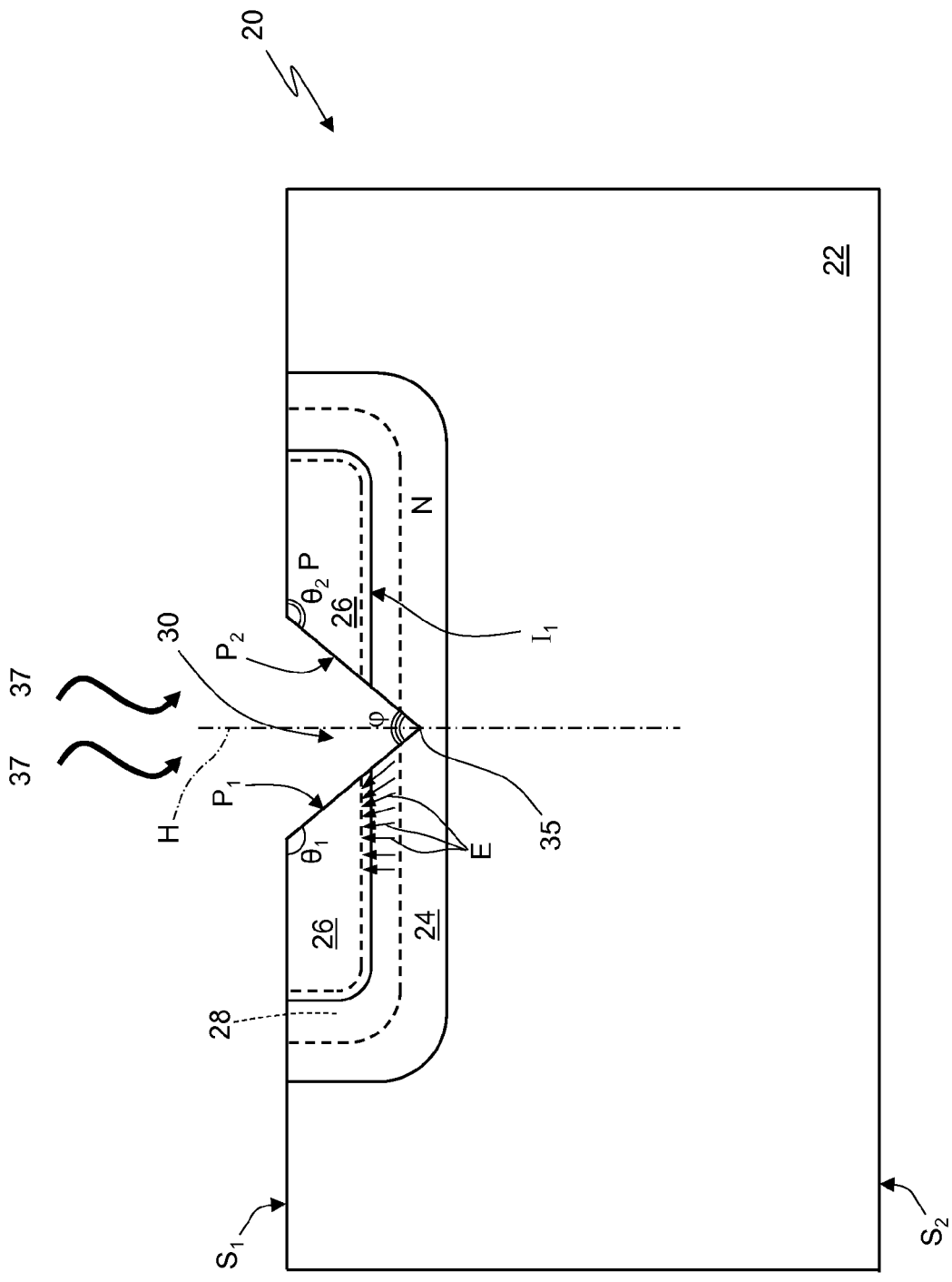
FIG. 4 is a schematic illustration of a cross section of one embodiment of the present optoelectronic detector.

FIG. 4 shows a photodiode 20, which includes a body 22 of semiconductor material and a first well 24 and a second well 26, which are also made of semiconductor material. The body 22 may include, in a way in itself known, a substrate and one or more epitaxial layers (not illustrated); moreover, the body 22 forms a first main surface S1 and a second main surface S2.

The first well 24 extends from the first main surface S1 and is surrounded at the bottom and laterally by the body 22, with which it is in direct contact.

The second well 26 extends from the first main surface S1 and is surrounded at the bottom and laterally by the first well 24, with which it is in direct contact. Purely by way of example, in the embodiment illustrated in FIG. 4, the first and second wells 24, 26 are doped, respectively, N and P.

The first and second wells 24, 26 hence form a PN junction and form a first interface surface I1, which separates the first well 24 from the second well 26.

The photodiode 20 further includes an anode contact and a cathode contact (not illustrated), coupled, respectively, to the second well 26 and to the first well 24 and designed to enable reverse biasing of the PN junction. In use, a depletion region 28 is thus formed, which extends through the first interface surface I1, and hence extends in part within the first well 24 and in part within the second well 26.

The photodiode 20 moreover forms a recess 30, which extends from the first main surface S1 and traverses the first well 26 and, at least in part, the second well 24.

In detail, the recess 30 is delimited laterally by a first side wall P1 and a second side wall P2, each of which is of a plane type and is transverse with respect to the first main surface S1; in particular, each one between the first side wall P1 and the second side wall P2 extends from the first main surface S1 and forms with it a nonzero angle other than 90°. Even more in particular, the first side wall P1 and the second side wall P2 form with the first main surface S1 an angle θ1 and an angle θ2 respectively, each of which is between 100° and 170°, in order to enable coupling of electromagnetic radiation coming from outside the photodiode 20, as described in detail hereinafter.

The recess 30 extends so that the first and second side walls P1, P2 are in contact with the first and second wells 24, 26. In other words, the PN junction formed by the first and second wells 24, 26 faces the first and second side walls P1, P2, i.e., gives out onto the recess 30. Furthermore, assuming an orthogonal reference system xyz, formed by the axes x, y, and z and such that the first and second main surfaces S1 and S2 are parallel to the plane xz, the embodiment illustrated in FIG. 4 is such that the first and second side walls P1, P2 are arranged specularly with respect to an axis H parallel to the axis y.

In addition, the first and second side walls P1, P2 are in mutual contact and form an angle φ between 10° and 170°. More in particular, in order to maximize coupling of the electromagnetic radiation to the photodiode 20, the angle φ is between 70° and 110° and is, for example, equal to 90°. Even more in particular, the first and second side walls P1, P2 form a line of contact 35, which lies within the first well 24.

The first interface surface I1 contacts both the first side wall P1 and the second side wall P2, which are arranged transverse to the first interface surface I1. In particular, the portions of the first interface surface I1 that are in contact with the first and second side walls P1, P2 are substantially parallel to the plane xz, and hence to the first main surface S1; consequently, the first and second side walls P1, P2 form with the first interface surface I1 angles, respectively, equal to θ1 and θ2 (equivalently, to 180°-θ1 and 180°-θ2). In other words, the PN junction formed by the first and second wells 24, 26 has a portion that contacts the first and second side walls P1, P2, this portion being substantially parallel to the first main surface S1.

In use, within the portions of the depletion region 28, which are arranged in contact with the first and second side walls P1, P2, there is thus a thickening and a progressive inclination of the lines of force of the electric field E, the closer these lines of force are to the first and second side walls P1, P2. In particular, the closer the lines of force are to the first and second side walls P1, P2, the more they tend to be parallel to these latter. Furthermore, if we designate as an "optical signal" 37 the electromagnetic radiation coming from the outside world, the optical signal penetrates into the recess 30 and thanks to the inclination of the first and second side walls P1, P2, couples to the photodiode 20, penetrating into the depletion region 28, and in particular into portions of the depletion region 28 in which the electric field is particularly high. The photons of the optical signal 37 can thus be absorbed in these high-electric-field portions, generating charge carriers that are accelerated by this electric field. By increasing doping of the second well 26 locally and in the proximity of the recess 30, it is moreover possible to obtain thinning-out (not illustrated) of the depletion region 28 so as to reduce the mean free path of the charge carriers (electrons and holes) through the depletion region 28.

The photodiode 20 is then characterized in that it supplies, in response to an optical signal, an electrical signal 37, the (so-called) fast component, of which, i.e., the component deriving from the charge carriers generated following upon absorption of photons within the depletion region 28, is generated with high rapidity. In fact, as previously explained, these charge carriers are subjected to a high electric field E. In other words, given a generic instant at which the optical signal 37 penetrates into the depletion region 28, the delay of the corresponding instant at which the photodiode 20 generates the corresponding electrical signal decreases. It follows that the photodiode 20 is characterized by a high operating frequency.

According to a different embodiment (illustrated in FIG. 5), arranged between the first and second wells 24, 26 is an intrinsic region 32. The recess 30 extends so as to traverse the intrinsic region 32 completely. In this way, if we designate by "first interface surface I1" the surface of separation between the second well 26 and the intrinsic region 32, and by "second interface surface I2" the surface that separates the intrinsic region 32 from the first well 24, both the first interface surface I1 and the second interface surface I2 are in contact both with the first side wall P1 and with the second side wall P2.

Figure 5:
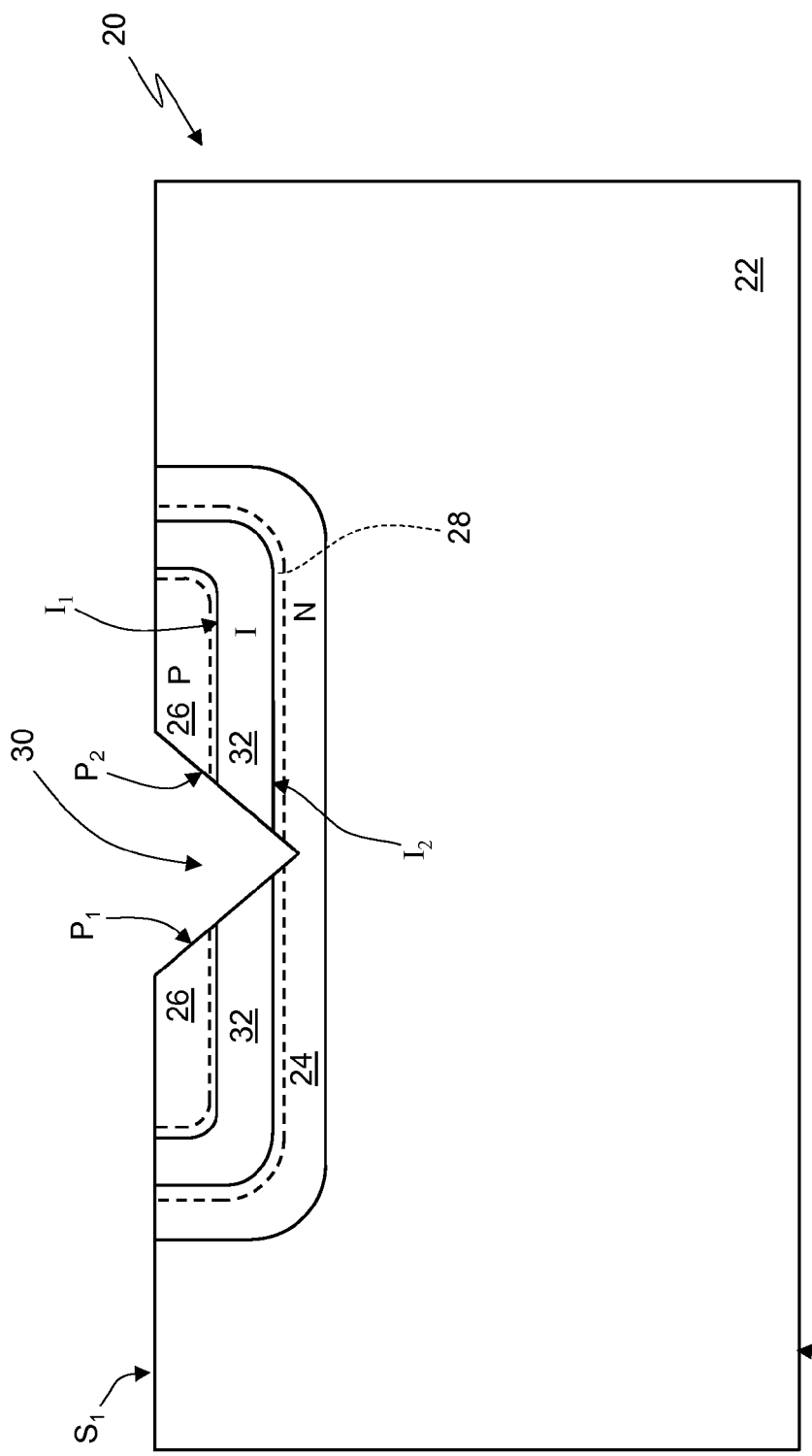
FIG. 5 is a schematic illustration of a cross section of one embodiment of the present optoelectronic detector, taken along a line of cross section V-V illustrated in FIG. 6.
Figure 6:
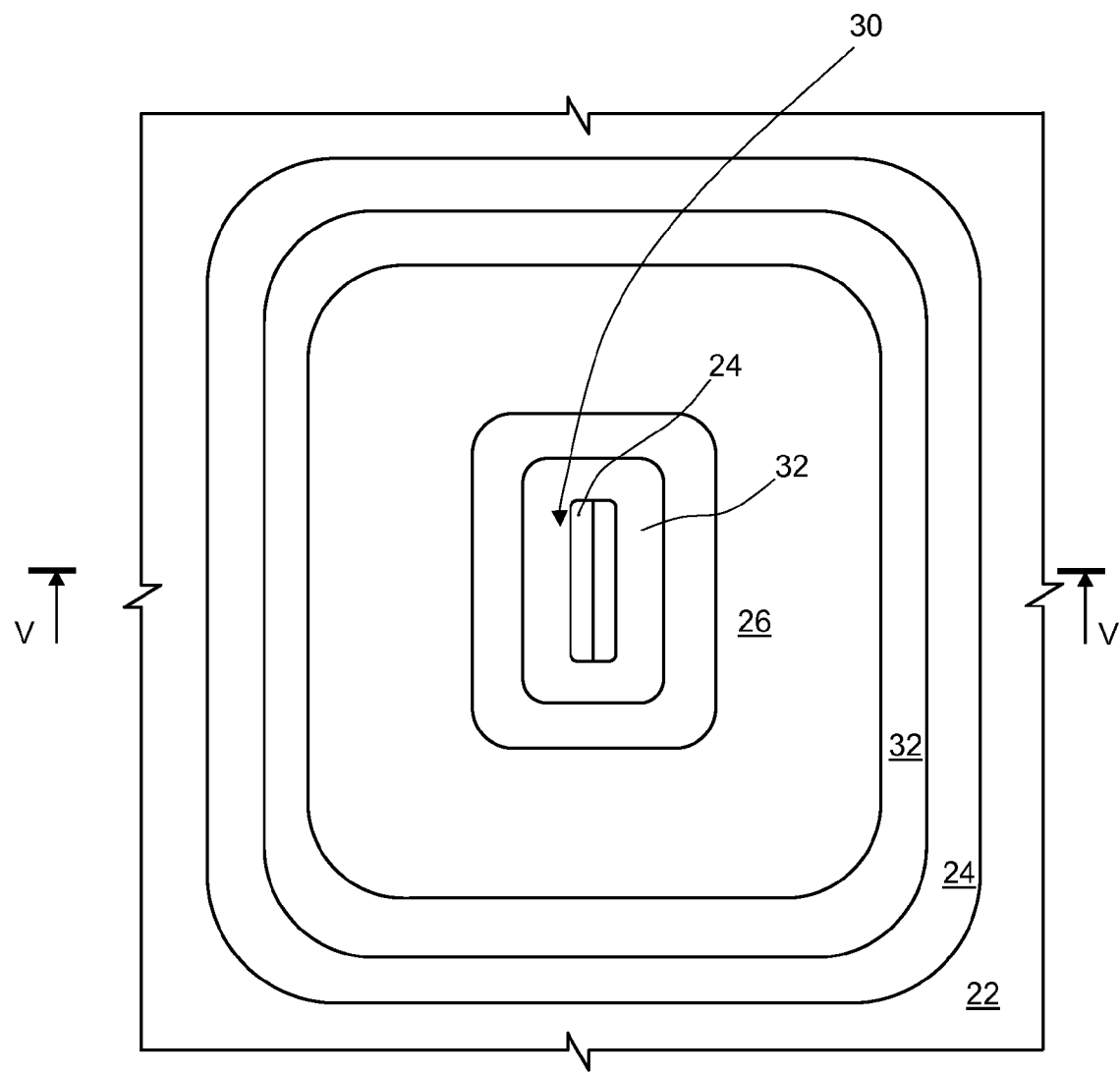
FIG. 6 is a schematic illustration of a top plan view of the optoelectronic detector illustrated in FIG. 5.

In practice, the embodiment illustrated in FIG. 5 regards a photodiode of the so-called PIN, instead of PN, type since the intrinsic region 32 and the first and second wells 24, 26 form precisely a junction of a PIN type. Furthermore, as illustrated purely by way of example in FIG. 6, the intrinsic region 32 and the first and second wells 24, 26, as on the other hand also the recess 30, have the shape, in top plan view, of a rectangle with rounded corners. It should be noted that, in this embodiment, the depletion region 28, in addition to extending in part into the first and second wells 24, 26, occupies entirely the intrinsic region 32.

Figure 7:
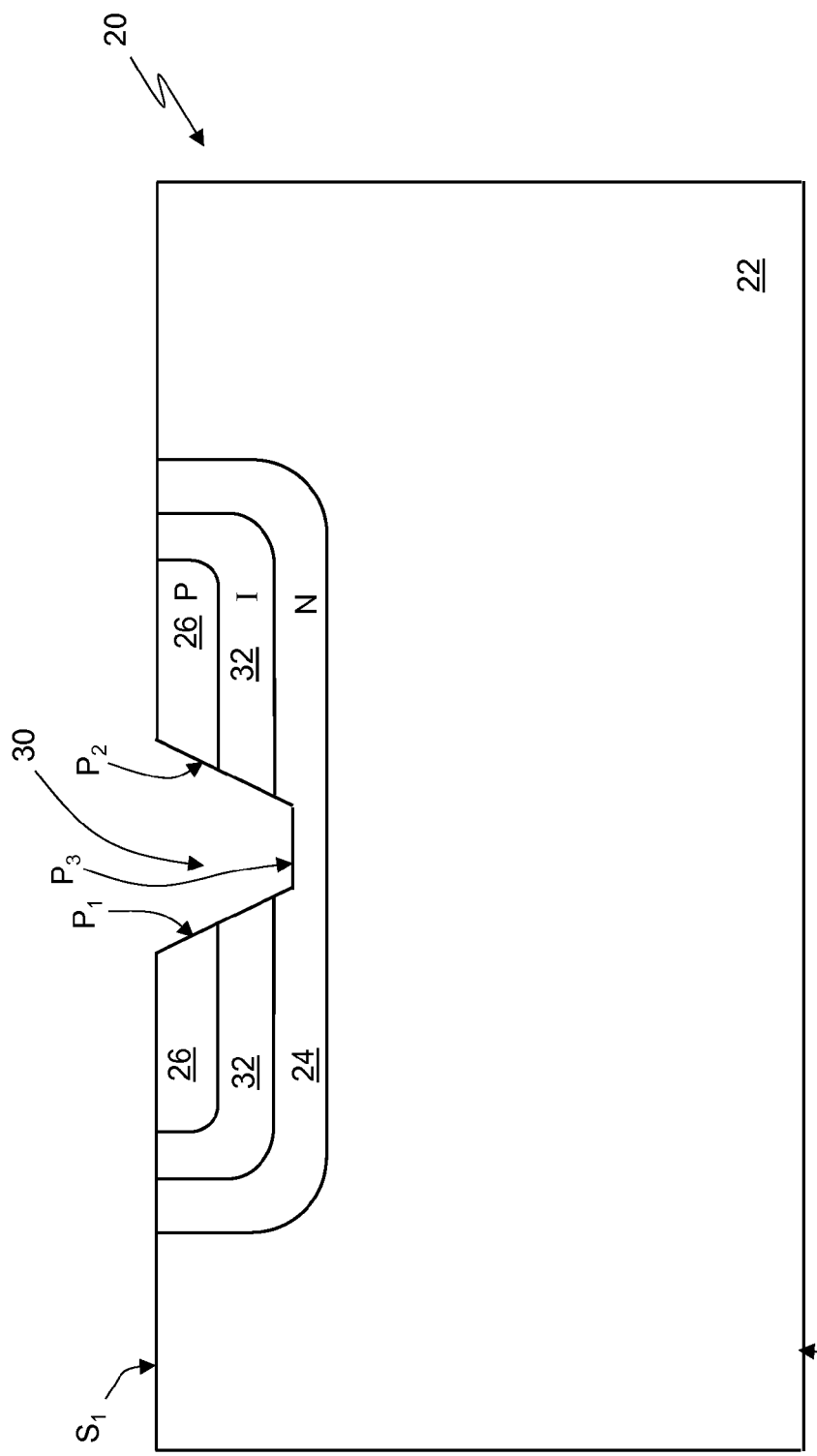
FIG. 7 is a schematic illustration of a cross section of a different embodiment of the present optoelectronic detector.

As illustrated in FIG. 7, moreover possible are different embodiments, where the photodiode 20 has a cross section such that the first and second side walls P1, P2 are not in mutual contact, but are coupled by a third side wall P3, which extends within the first well 24, parallel to the first main surface S1.

Figure 8A:
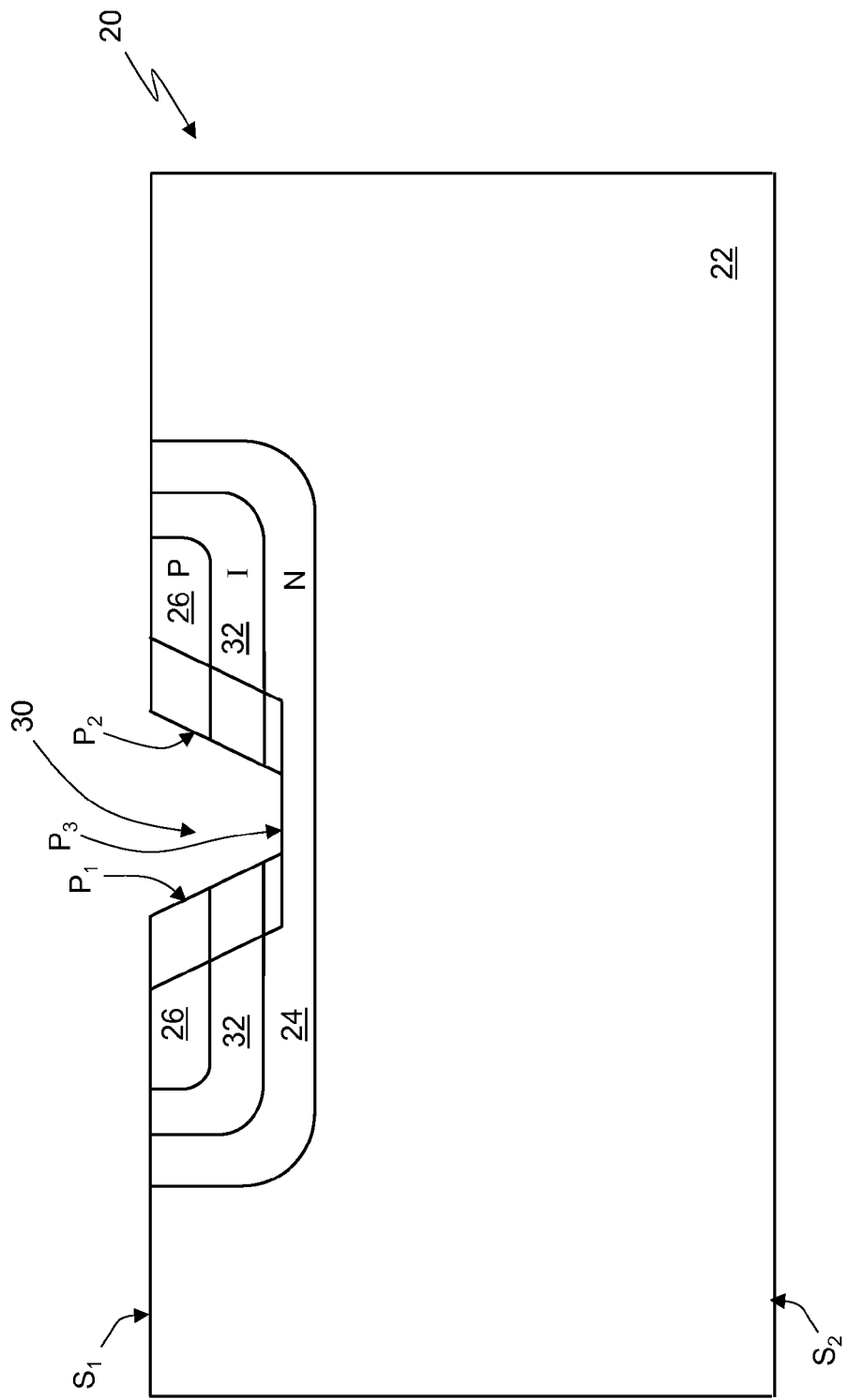
FIG. 8a is a schematic illustration of a cross section of a further embodiment of the present optoelectronic detector, taken along a line of cross section VIIIa-VIIIa illustrated in FIG. 8b.
Figure 8B:
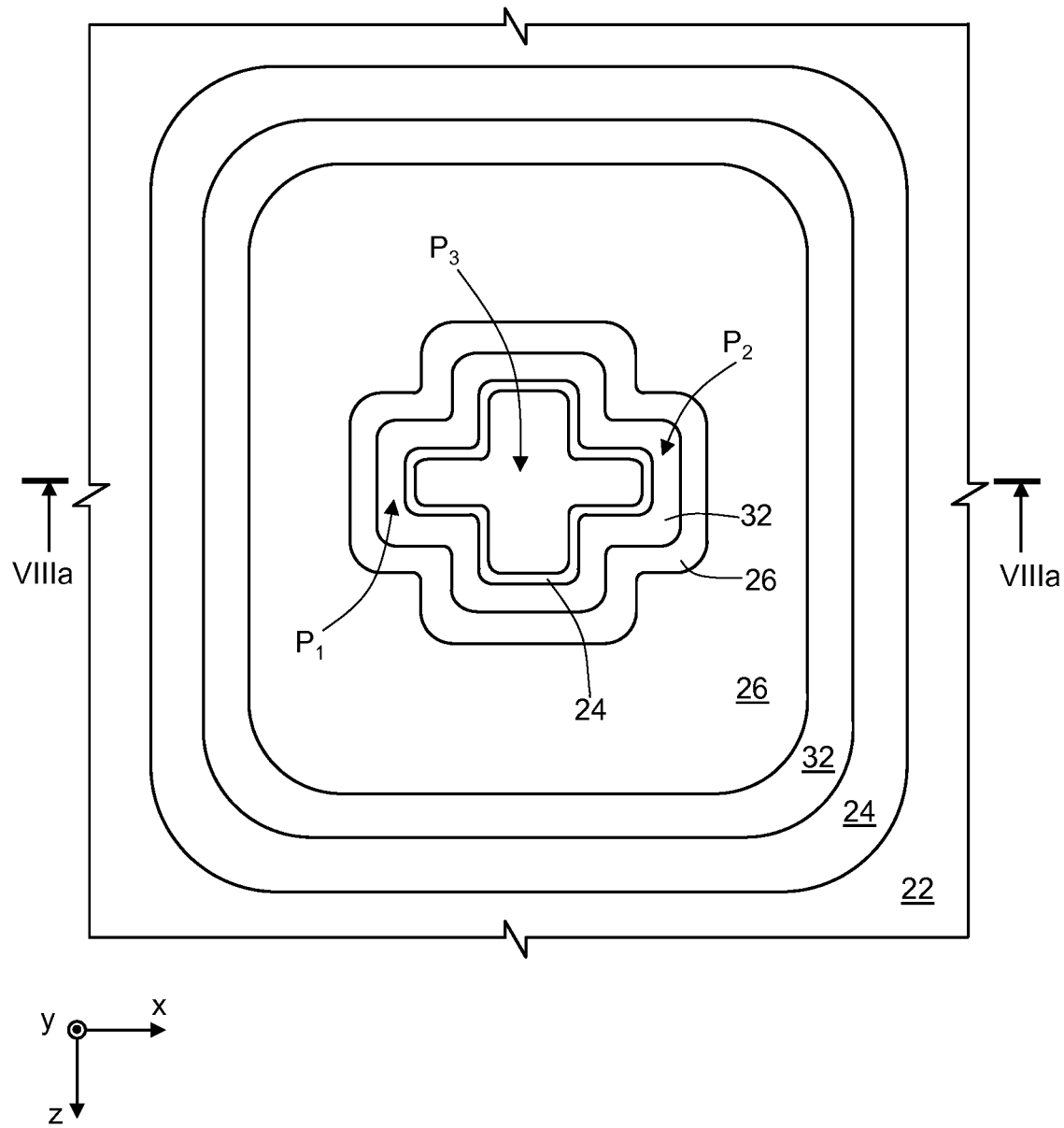

Moreover possible are embodiments of the type illustrated in FIGS. 8a and 8b. According to this embodiment, the photodiode 20 has a first cross section and a second cross section, obtained by sectioning with two planes parallel to the plane xy and corresponding, respectively, to a first value and a second value of the co-ordinate z, said first and second cross sections being different from one another. In particular, the first cross section is equal to the cross section illustrated in FIG. 7, while the second cross section is illustrated in FIG. 8a. In practice, according to this embodiment, the recess 30 has the shape, in top plan view, of a cross. In this way, with respect to the embodiment illustrated in FIG. 6, the area of the depletion region 28 exposed to the electromagnetic radiation is found to be increased, and consequently the intensity of the electrical signal generated by the photodiode 20 increases. Further embodiments are in any case possible, where the recess 30 has a comb-fingered shape in top plan view.

Figure 9:
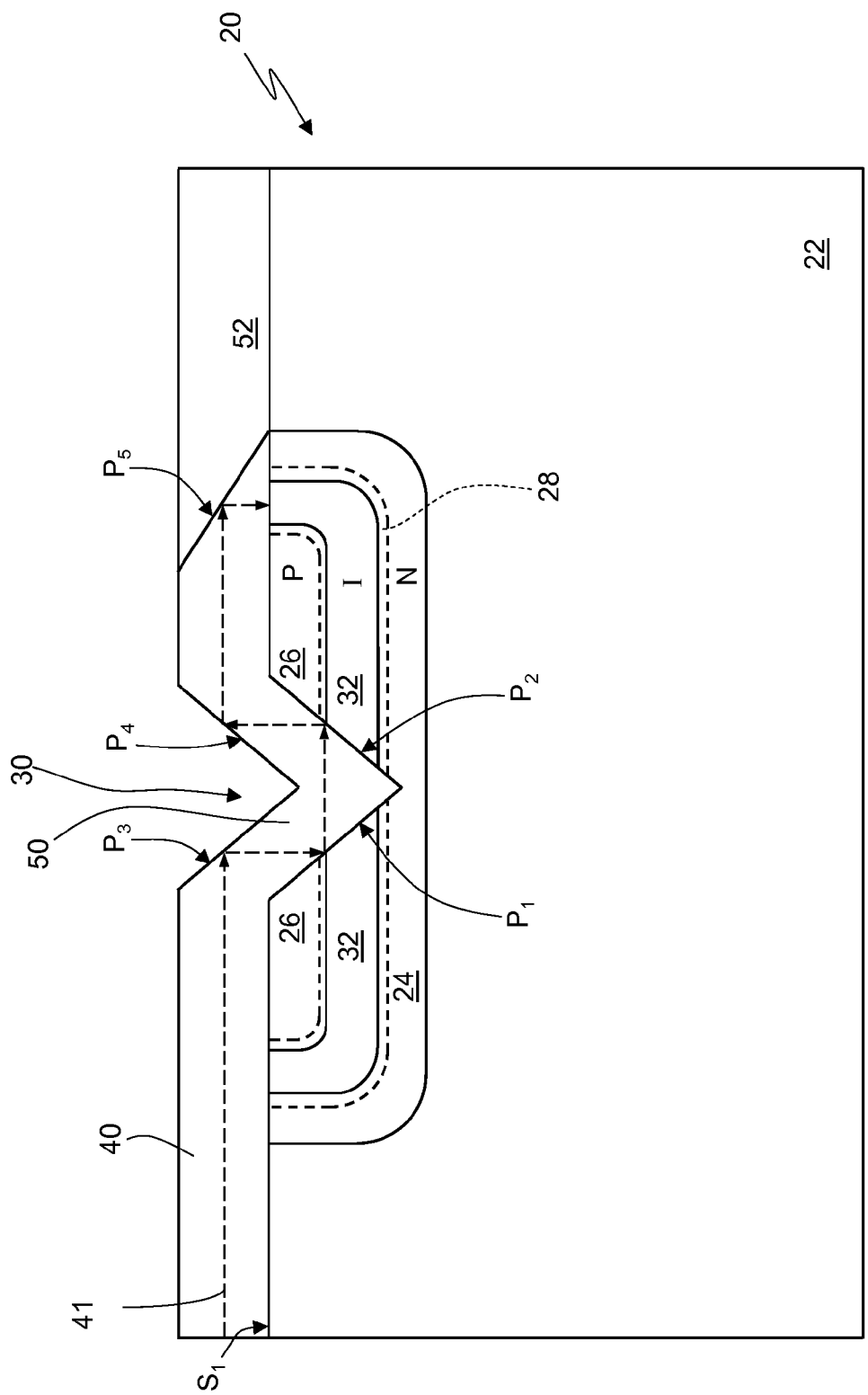
FIG. 9-14 are schematic illustrations of cross sections of further embodiments of the present optoelectronic detector.

As illustrated in FIG. 9, with reference by way of example to the case of a photodiode of a PIN type, the photodiode 20 may include a top layer 40, which extends over the first main surface S1, with which it is in direct contact.

The top layer 40 is designed to enable propagation of the optical signal and occupies the recess 30, being arranged in direct contact with the first and second side walls P1, P2. In order to enable propagation of the optical signal, the top layer 40 is made of a material having a refractive index greater than the refractive index of the semiconductor material that forms the body 22.

In detail, the top layer 40 has a contact portion 50, which occupies the recess 30; the contact portion 50 in direct contact with the first and second interface surfaces I1, I2, i.e., is in contact with the intrinsic region 32 and with the first and second wells 24, 26. Furthermore, the contact portion 50 has, for example, a constant thickness along the axis x. Consequently, in addition to being delimited at the bottom by the first and second side walls P1, P2, the contact portion 50 is delimited at the top by a third side wall P3 and a fourth side wall P4, respectively, parallel to the first and second side walls P1, P2; moreover, the third and fourth side walls P3, P4 are at one and the same distance (equal to the thickness of the top layer) from the first side wall P1 and the second side wall P2, respectively.

The top layer 40 is moreover delimited, at one of its ends, by a fifth side wall P5, which is also of a planar type. The fifth side wall P5 is laterally staggered with respect to the first and second side walls P1, P2 and also overlies the intrinsic region 32 and the first and second wells 24, 26; moreover the fifth side wall P5 overlies the first main surface S1, with respect to which it is inclined by an angle equal, for example, to 45°. An additional region 52 is arranged in contact with the fifth side wall P5, on top of the first main surface S1. This additional region 52 has a refractive index less than the refractive index of the material that forms the top layer 40.

In use, an optical signal 41 propagates along the top layer 40 until it reaches the contact portion 50 where, on account of reflections at the first and third side walls P1, P3, it is in part directed in the depletion region 28, with consequent generation of the corresponding electrical signal. Part of the optical signal traverses, however, the contact portion 50, continuing to propagate along the top layer 40 until it reaches the fifth side wall P5, where it is reflected in the direction of the depletion region 28. In this way, the efficiency of the coupling between the photodiode 20 and the top layer 40 is increased.

Figure 10:
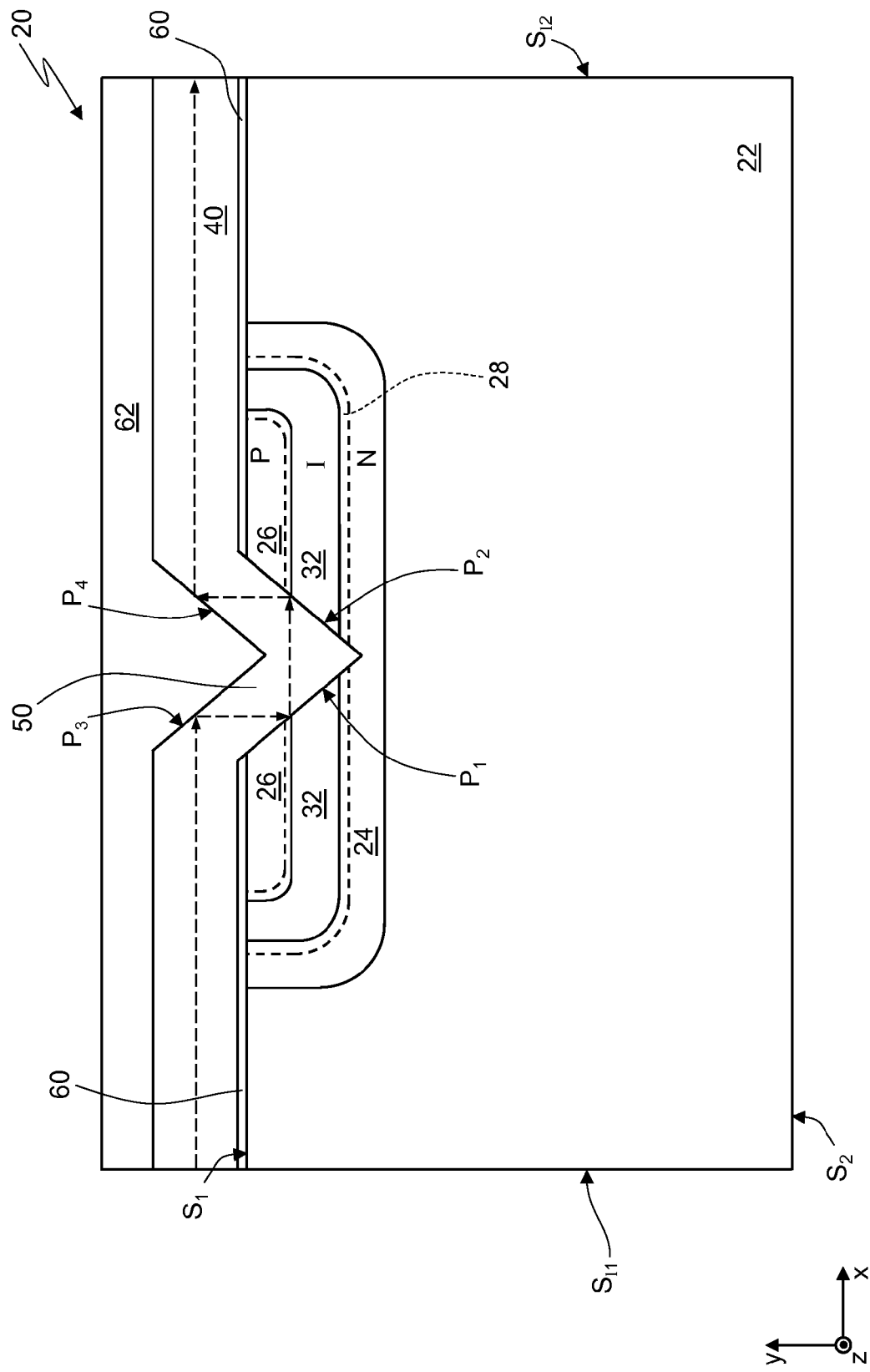

As illustrated in FIG. 10, assuming that the body 22 moreover forms a first side surface SI1 and a second side surface SI2, the top layer 40 may extend laterally between a first side surface SI1 and a second side surface SI2. Furthermore, as illustrated once again in FIG. 10, between the top layer 40 and the body 22 there may be arranged a first coating layer 60, which extends on the first main surface S1; in this case, the contact portion 50 extends through the first coating layer 60. Furthermore, extending on top of the top layer 40, and in direct contact therewith, is a second coating layer 62. The first and second coating layers 60, 62 may be made of one and the same material, which has a refractive index less than the refractive index of the material that forms the top layer 40 so that the top layer 40 and the first and second coating layers 60, 62 form a waveguide, optically coupled to the depletion region 28.

Figure 11:
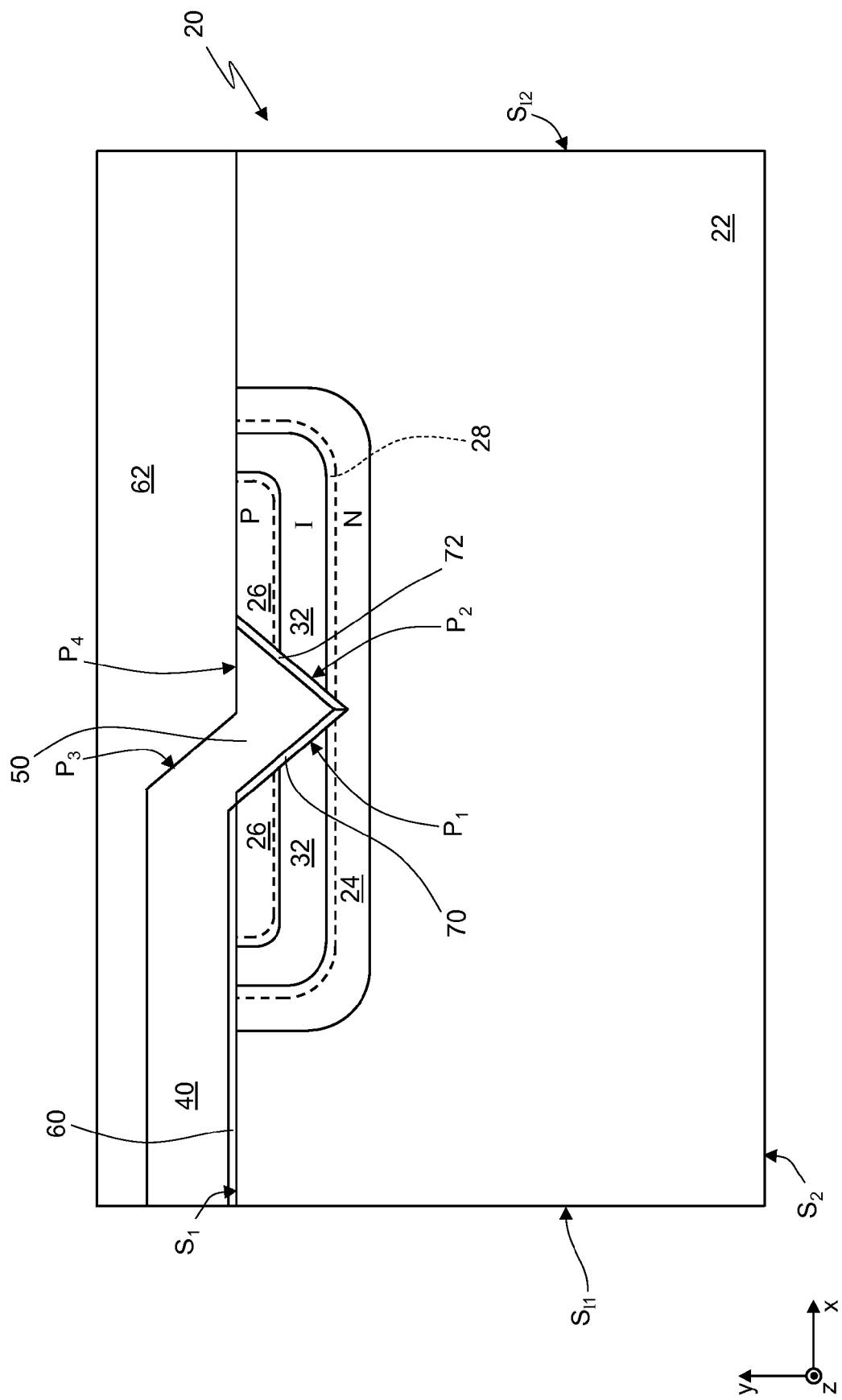

In a different embodiment, illustrated in FIG. 11, the fourth side wall P4, instead of being parallel to the second side wall P2, is coplanar to the first main surface S1. Furthermore, the first and second side walls P1, P2 are coated, respectively, by a first anti-reflection layer 70 and a second anti-reflection layer 72, which have, for example, thicknesses equal to integer and odd multiples of a quarter of the wavelength of the optical signal. This embodiment performs the function of causing the optical signal to be absorbed entirely by the photodiode 20.

Figure 12:
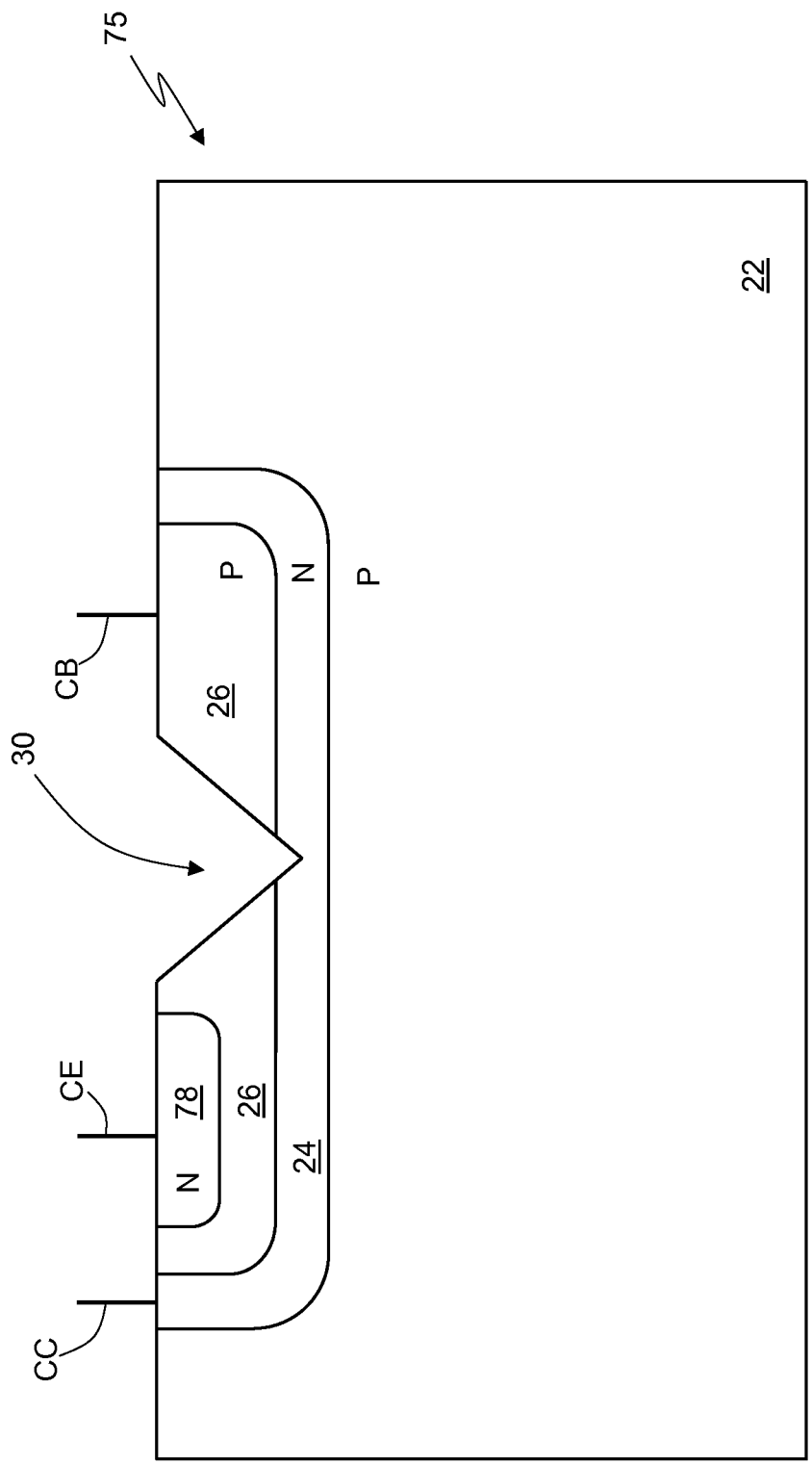

FIG. 12 shows, instead, a phototransistor 75 of the so-called bipolar type, where the body 22 has a doping of a P type, and where, within the second well 26, there extends a third well 78, of an N type and arranged laterally at a distance from the recess 30. FIG. 12 moreover shows the collector, base, and emitter contacts, which are designated, respectively, by CC, CB and CE and contact, respectively, the first, second, and third wells 24, 26, 78.

Figure 13:
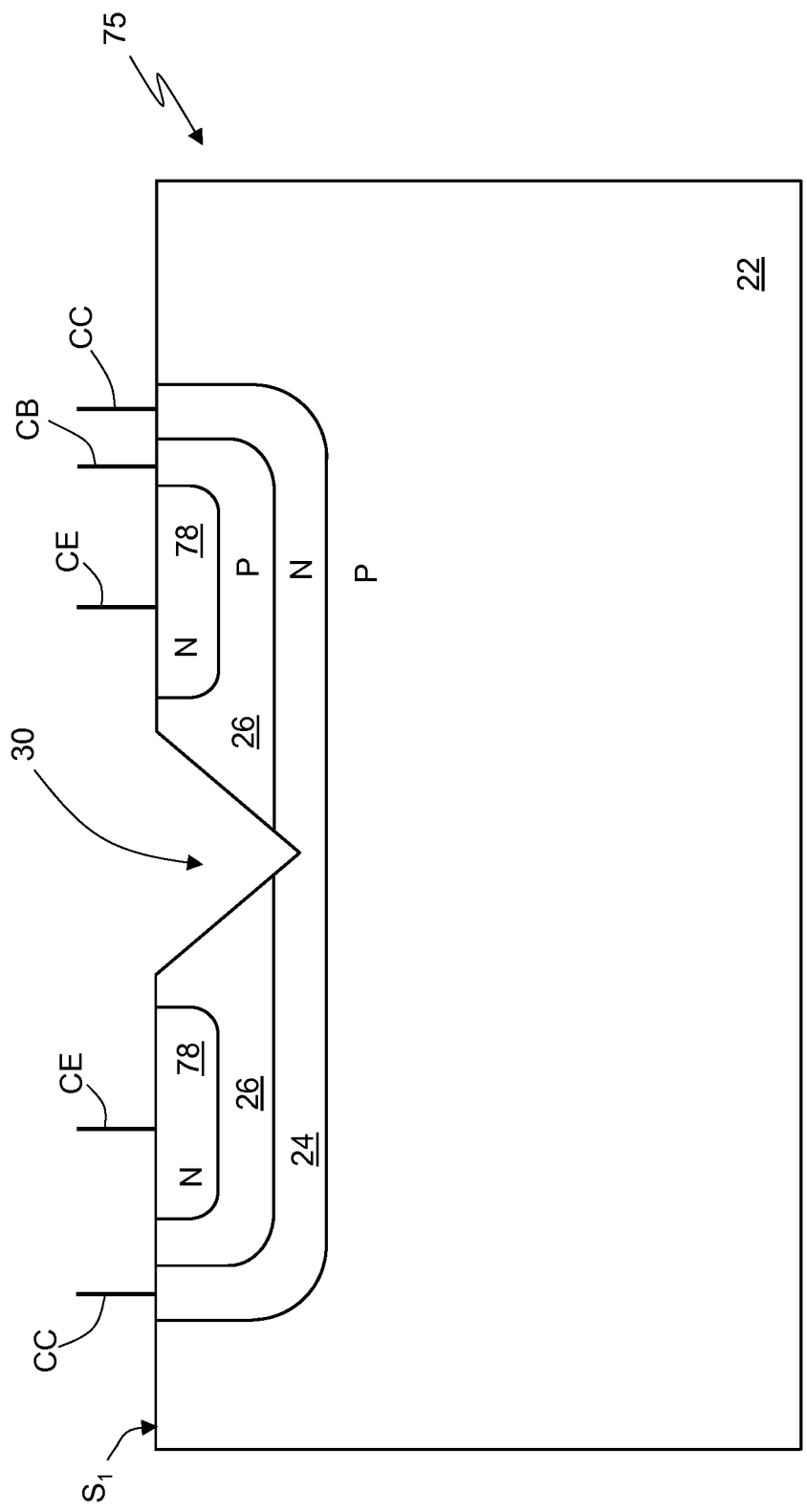

In a further embodiment (illustrated in FIG. 13), the third well 78 has the shape, in top plan view, of an annulus or of a polygon and is arranged so as to surround the recess 30, from which it is arranged laterally at a distance; in this way, a symmetrical structure is formed that benefits from the advantages provided by the recess 30. Even though it is not illustrated, a decoupling layer, of an N+ type, may be set between the first well 24 and the body 22, in order to reduce the electrical resistance between them.

Figure 14:
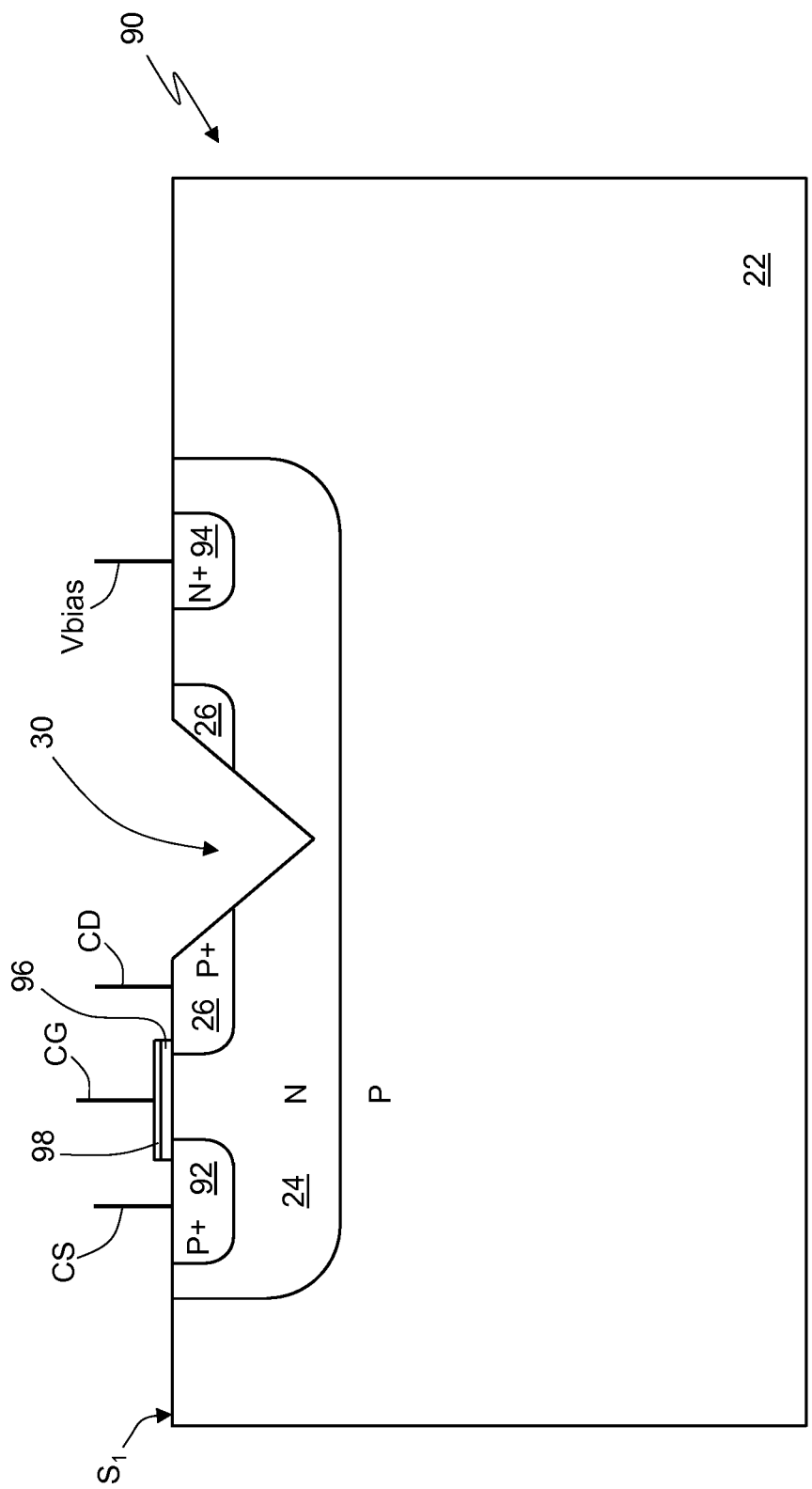

FIG. 14 shows, instead, a phototransistor 90 of a MOS type, where the third well, designated by 92, is of a P+ type and extends within the first well 24, starting from the first main surface S1. Furthermore, the phototransistor 90 includes the fourth well, designated by 94, which is of an N+ type and also extends within the first well 24, starting from the first main surface S1. The second well 26 is arranged laterally at a distance, between the third and fourth wells 92, 94.

On top of the first main surface S2 there extends a dielectric region 96, laterally staggered with respect to the second and third wells 26, 92, with which it is in direct contact; the dielectric region 96 is moreover in direct contact with the first well 24. Extending on top of the dielectric region 96, and in direct contact therewith, is a conductive region 98, which forms precisely a MOS structure with the dielectric region 96 and the first well 24. FIG. 14 moreover shows source, gate, and drain contacts, which are designated, respectively, by CS, CG, and CD, and contact, respectively, the third well 92, the conductive region 98, and the second well 26. Moreover, FIG. 14 shows in biasing contact Vbias, which contacts the fourth well 94 in order to enable biasing of the first well 24 and enable the phototransistor 90 to function correctly.

In other embodiments, an optoelectronic device or detector according the above described embodiments or other embodiments may be contained within an integrated circuit, such as an image sensor. Moreover, the integrated circuit may be contained in an electronic system, such as a smartphone, digital camera, or computer system. The electronic system may, for example, include a first integrated circuit such as an image sensor coupled to a second integrated circuit like a processor, where the image sensor and processor may be formed on the same semiconductor die or on different semiconductor dies.

The advantages that the present optoelectronic detector affords emerge clearly from the foregoing description. In particular, irrespective of whether the present optoelectronic detector forms a photodiode, a phototransistor of a bipolar type or MOS type, or else some other kind of optoelectronic device, it is characterized by a high operating frequency, as well as a high sensitivity, obtained by means of increase of the electric field within the depletion region.

Finally, it is clear that modifications and variations may be made with respect to what has been described and illustrated herein, without thereby departing from the sphere of protection of the present invention, as defined in the annexed claims.

For example, as mentioned previously, embodiments regarding optoelectronic devices and components are possible that differ from the ones described and illustrated. Furthermore, all the types of doping can be reversed with respect to what has been described previously. In addition to this, instead of the intrinsic region 32, there may be present a region with a low level of doping, of a P type or N type.

It is likewise possible for the recess to be arranged so that the first and second wells, as well as the intrinsic region (if present) are arranged all on one and the same side with respect to the recess.

What is claimed is:

1. An optoelectronic device, comprising:
    a body of semiconductor material, the body including a first main surface;
    a first region formed in the body;
    a second region formed within the first region, wherein the first and second regions are of opposite conductivity types to form a junction between the first and second regions and a depletion region at the junction;
    a recess extending from the first main surface of the body through the second region and into the first region to intersect the depletion region at a sidewall of the recess;
    a top layer formed over the first main surface that includes a portion formed in the recess, the top layer having an index of refraction that is greater than an index of refraction of the body and being operable to expose the intersected depletion region at said sidewall to electromagnetic radiation propagating through the top layer;
    wherein the recess includes a first side wall having a first angle relative to the first main surface of the body, said first angle being between, but not equal to either of, zero and ninety degrees.

2. The optoelectronic device of claim 1, wherein the recess includes a second side wall having a second angle relative to the first main surface of the body, said second angle being between, but not equal to either of, zero and ninety degrees.

3. The optoelectronic device of claim 2, wherein the first and second angles are equal to each other.

4. The optoelectronic device of claim 1, wherein the junction is a junction of a planar structure type photodiode.

5. An optoelectronic device comprising:
    a body of semiconductor material, the body including a first main surface;
    a first region formed in the body;
    a second region formed within the first region, wherein the first and second regions are of opposite conductivity types to form a junction between the first and second regions and a depletion region at the junction;
    a recess extending from the first main surface of the body through the second region and into the first region to intersect the depletion region at a sidewall of the recess, wherein said recess is configured to expose the intersected depletion region at said sidewall to electromagnetic radiation;
    wherein the recess includes a first side wall having a first angle relative to the first main surface of the body, said first angle being between, but not equal to either of, zero and ninety degrees;
    a third region formed within the second region; and
    wherein the first region corresponds to a collector, the second region corresponds to a base, and the third region corresponds to an emitter of a bipolar junction transistor.

6. The optoelectronic device of claim 5 wherein the third region comprises an annular region that surrounds the recess.

7. An optoelectronic device comprising:
    a body of semiconductor material, the body including a first main surface;
    a first region formed in the body;
    a second region formed within the first region, wherein the first and second regions are of opposite conductivity types to form a junction between the first and second regions and a depletion region at the junction;
    a recess extending from the first main surface of the body through the second region and into the first region to intersect the depletion region at a sidewall of the recess, wherein said recess is configured to expose the intersected depletion region at said sidewall to electromagnetic radiation;
    wherein the recess includes a first side wall having a first angle relative to the first main surface of the body, said first angle being between, but not equal to either of, zero and ninety degrees;
    a third region formed within the first region; and
    wherein the first region corresponds to a body, the second region corresponds to a drain, and the third region corresponds to a source of a MOS transistor.

8. An optoelectronic device, comprising:
    a body of semiconductor material, the body including a first main surface;
    a first region having a first conductivity type formed in the body;
    a second region of intrinsic material formed within the first region;
    a third region having a second conductivity type opposite the first conductivity type formed within the second region to form a junction between the first, second and third regions and a depletion region at the junction;
    a recess extending from the first main surface of the body through the second and third regions and into the first region to intersect the depletion region in the recess;
    a top layer formed over the first main surface that includes a portion formed in the recess, the top layer having an index of refraction that is greater than an index of refraction of the body and being operable to expose the intersected depletion region to electromagnetic radiation propagating through the top layer;
    wherein the recess includes a first side wall having a first angle relative to the first main surface of the body, said first angle being between, but not equal to either of, zero and ninety degrees.

9. The optoelectronic device of claim 8, wherein the junction is PIN type junction comprising the first region being an N type semiconductor material, the second region being an intrinsic semiconductor material, and the third region being a P type semiconductor material.

10. The optoelectronic device of claim 8,
wherein the recess comprises a second side wall extending from the first main surface into the first region; and
wherein the recess comprises a third side wall extending within the first region between the first and second side walls, the third side wall having a surface that is substantially parallel to the first main surface.

11. The optoelectronic device of claim 10, wherein the recess has a cross shape when viewed in a plan parallel to the first main surface.

12. An optoelectronic device comprising:
a body of semiconductor material, the body including a first main surface;
a first region having a first conductivity type formed in the body;
a second region of intrinsic material formed within the first region;
a third region having a second conductivity type opposite the first conductivity type formed within the second region to form a junction between the first, second and third regions and a depletion region at the junction;
a recess extending from the first main surface of the body through the second and third regions and into the first region to intersect the depletion region in the recess for exposure of the intersected depletion region to electromagnetic radiation;
wherein the recess includes a first side wall having a first angle relative to the first main surface of the body, said first angle being between, but not equal to either of, zero and ninety degrees; and
a top layer formed over the first main surface that includes a portion formed in the recess, the top layer having an index of refraction that is greater than an index of refraction of the body and being operable to enable electromagnetic radiation in the form of an optical signal to propagate through the top layer to the depletion region.

13. The optoelectronic device of claim 12,
wherein the recess has a second side wall extending from the first main surface into the first region;
wherein the portion of the top layer has a third side wall that is parallel to the first side wall; and
wherein the portion of the top layer has a fourth side wall that is parallel to the second side wall.

14. The optoelectronic device of claim 12 further comprising:
a first coating layer formed on the first main surface of the body with the top layer being formed on the first coating layer;
a second coating layer formed on the top layer and on the third and fourth sidewalls of the portion of the top layer; and
wherein the top layer and the first and second coating layers form a waveguide to direct electromagnetic radiation in the form of an optical signal to the depletion region in the recess.

15. An optoelectronic device, comprising:
a body of semiconductor material, the body including a first main surface;
a first region having a first conductivity type formed in the body;
a second region of intrinsic material formed within the first region;
a third region having a second conductivity type opposite the first conductivity type formed within the second region to form a junction between the first, second and third regions and a depletion region at the junction;
a recess extending from the first main surface of the body through the second and third regions and into the first region to intersect the depletion region in the recess for exposure of the intersected depletion region to electromagnetic radiation;
wherein the recess includes a first side wall having a first angle relative to the first main surface of the body, said first angle being between, but not equal to either of, zero and ninety degrees;
wherein the recess has a second side wall extending from the first main surface into the first region;
wherein a first anti-reflection layer is formed on the first side wall and a second anti-reflection layer is formed on the second side wall;
wherein a first coating layer is formed on a portion of the first main surface;
wherein a top layer is formed on the first coating layer and includes a portion formed in the recess on the first and second anti-reflection layers;
wherein the portion of the top layer has a third side wall that is parallel to the first side wall;
wherein the portion of the top layer has a fourth side wall that is parallel to the first main surface; and
wherein a second coating layer is formed on the top layer and on the portion of the first main surface on which the first coating layer is not formed.

16. An integrated circuit, comprising:
an optoelectronic device including,
a body of semiconductor material, the body including a first main surface;
a first region formed in the body;
a second region formed within the first region, wherein the first and second regions are of opposite conductivity types to form a junction between the first and second regions and a depletion region at the junction;
a recess extending from the first main surface of the body through the second region and into the first region to intersect the depletion region in the recess; and
a light guide extending over the first main surface and into said recess, said light guide configured to direct an optical signal onto said intersected depletion region;
wherein the recess includes a first side wall having a first angle relative to the first main surface of the body, said first angle being between, but not equal to either of, zero and ninety degrees.

17. The integrated circuit of claim 16, wherein the junction comprises one of a photodiode and a transistor.

* * * * *